(12) United States Patent
Den Boef et al.

(10) Patent No.: US 7,852,459 B2
(45) Date of Patent: Dec. 14, 2010

(54) INSPECTION METHOD AND APPARATUS, LITHOGRAPHIC APPARATUS, LITHOGRAPHIC PROCESSING CELL AND DEVICE MANUFACTURING METHOD

(75) Inventors: Arie Jeffrey Den Boef, Waalre (NL); Stanislav Y. Smirnov, Bethel, CT (US); Adel Joobeur, Milford, CT (US)

(73) Assignee: ASML Netherlands B.V., Veldhoven (NL)

( * ) Notice: Subject to any disclaimer, the term of this patent is extended or adjusted under 35 U.S.C. 154(b) by 499 days.

(21) Appl. No.: 11/701,516

(22) Filed: Feb. 2, 2007

(65) Prior Publication Data

US 2008/0186482 A1  Aug. 7, 2008

(51) Int. Cl.
*G03B 27/42* (2006.01)

(52) U.S. Cl. .................. 355/53; 356/237.2
(58) Field of Classification Search ............ 355/53; 356/237.2
See application file for complete search history.

(56) References Cited

U.S. PATENT DOCUMENTS

| | | | |
|---|---|---|---|
| 5,703,692 A | 12/1997 | McNeil et al. | 356/445 |
| 5,717,518 A | 2/1998 | Shafer et al. | 359/357 |
| 5,877,859 A * | 3/1999 | Aspnes et al. | 356/364 |
| 5,880,838 A | 3/1999 | Marx et al. | 356/351 |
| 5,963,329 A | 10/1999 | Conrad et al. | 356/372 |
| 6,147,815 A | 11/2000 | Fujie | 359/742 |
| 6,411,371 B1 | 6/2002 | Hinderling et al. | |
| 6,608,690 B2 | 8/2003 | Niu et al. | 356/635 |
| 6,664,121 B2 | 12/2003 | Grodnensky et al. | 438/16 |
| 6,699,624 B2 | 3/2004 | Niu et al. | 430/5 |
| 6,704,661 B1 | 3/2004 | Opsal et al. | 702/27 |
| 6,721,691 B2 | 4/2004 | Bao et al. | 702/189 |
| 6,738,138 B2 | 5/2004 | Wei | 356/369 |
| 6,753,961 B1 | 6/2004 | Norton et al. | 356/364 |
| 6,768,983 B1 | 7/2004 | Jakatdar et al. | 706/46 |
| 6,772,084 B2 | 8/2004 | Bischoff et al. | 702/127 |
| 6,785,638 B2 | 8/2004 | Niu et al. | 702/189 |
| 6,813,034 B2 | 11/2004 | Rosencwaig et al. | 356/601 |
| 6,819,426 B2 | 11/2004 | Sezginer et al. | 356/401 |
| 6,856,408 B2 | 2/2005 | Raymond | 356/601 |
| 6,919,964 B2 | 7/2005 | Chu | 356/601 |
| 6,928,628 B2 | 8/2005 | Seligson et al. | 716/4 |
| 6,972,852 B2 | 12/2005 | Opsal et al. | 356/625 |
| 6,974,962 B2 | 12/2005 | Brill et al. | 250/548 |
| 6,987,572 B2 | 1/2006 | Lakkapragada et al. | 356/601 |

(Continued)

FOREIGN PATENT DOCUMENTS

JP  10-307004 A  11/1998

(Continued)

OTHER PUBLICATIONS

Notice of Reasons for Rejection mailed Sep. 1, 2010 for Japanese Patent Application No. 2008-139438, 3 pgs.

*Primary Examiner*—Edward J Glick
*Assistant Examiner*—Mesfin T Asfaw
(74) *Attorney, Agent, or Firm*—Sterne, Kessler, Goldstein & Fox P.L.L.C.

(57) ABSTRACT

A scatterometer has a radiation source capable of emitting radiation in distinct first and second wavelength ranges. An adjustable optical element is provided to effect a chromatic correction as necessary according to which wavelength range is in use. A single scatterometer can thereby effect measurements using widely separated wavelengths.

20 Claims, 3 Drawing Sheets

U.S. PATENT DOCUMENTS

| | | | |
|---|---|---|---|
| 7,046,376 B2 | 5/2006 | Sezginer | 356/601 |
| 7,061,615 B1 | 6/2006 | Lowe-Webb | 356/401 |
| 7,061,623 B2 | 6/2006 | Davidson | 356/497 |
| 7,061,627 B2 | 6/2006 | Opsal et al. | 356/601 |
| 7,067,819 B2 * | 6/2006 | Janik | 250/372 |
| 7,068,363 B2 | 6/2006 | Bevis et al. | 356/237.5 |
| 2002/0089654 A1 * | 7/2002 | Ota et al. | 355/67 |
| 2004/0115843 A1 * | 6/2004 | Wack et al. | 438/14 |
| 2004/0119970 A1 | 6/2004 | Dusa et al. | 356/237.1 |
| 2004/0218262 A1 | 11/2004 | Chuang et al. | 359/366 |
| 2005/0058446 A1 * | 3/2005 | Plug | 396/611 |
| 2005/0128468 A1 * | 6/2005 | Murata | 356/127 |
| 2006/0033921 A1 | 2/2006 | Den Boef et al. | 356/446 |
| 2006/0066855 A1 | 3/2006 | Den Boef et al. | 356/401 |
| 2006/0126074 A1 | 6/2006 | Van Der Werf et al. | 356/489 |
| 2006/0139592 A1 | 6/2006 | Den Boef et al. | 355/53 |
| 2006/0244937 A1 | 11/2006 | Nolscher et al. | 355/52 |
| 2006/0256324 A1 | 11/2006 | Den Boef et al. | 356/237.2 |
| 2007/0003840 A1 | 1/2007 | Van Der Schaar et al. | 430/5 |
| 2007/0003849 A1 | 1/2007 | Shirai | |
| 2007/0007428 A1 * | 1/2007 | Ri | 250/201.3 |

FOREIGN PATENT DOCUMENTS

| | | |
|---|---|---|
| JP | 2000-088566 A | 3/2000 |
| JP | 2002-260994 A | 9/2002 |
| JP | 2002-267416 A | 9/2002 |
| JP | 2002-350117 A | 12/2002 |
| JP | 2004-125454 A | 4/2004 |
| JP | 2005-106754 A | 4/2005 |
| JP | 2005-201756 A | 7/2005 |
| WO | WO 01/46657 A1 | 6/2001 |

* cited by examiner

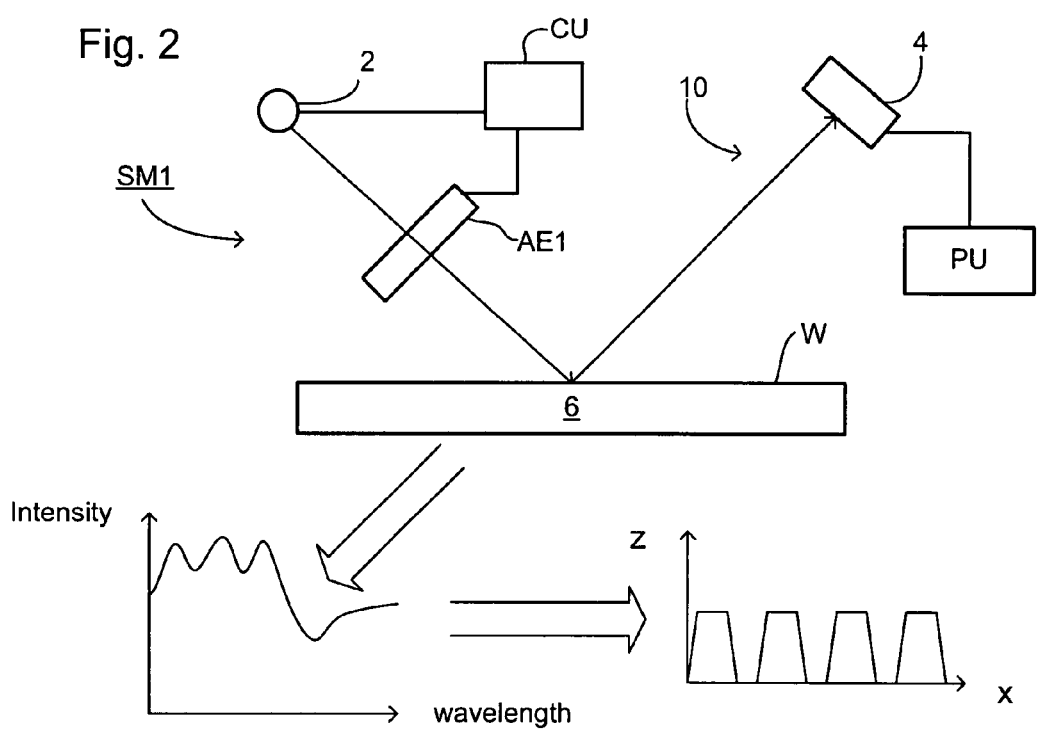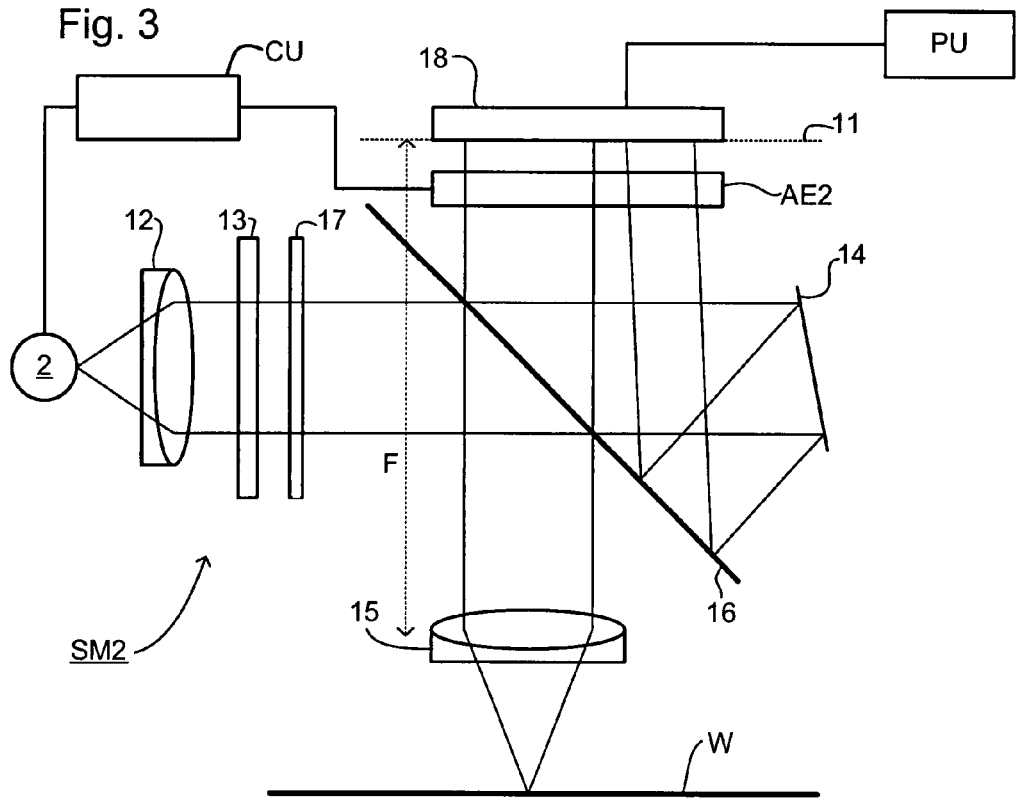

INSPECTION METHOD AND APPARATUS, LITHOGRAPHIC APPARATUS, LITHOGRAPHIC PROCESSING CELL AND DEVICE MANUFACTURING METHOD

FIELD

The present invention relates to a method of inspection usable, for example, in the manufacture of a device by a lithographic technique and to a method of manufacturing a device using a lithographic technique, and in particular to a scatterometric method.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti parallel to this direction. It is also possible to transfer the pattern from the patterning device to the substrate by imprinting the pattern onto the substrate.

In order to monitor the lithographic process, one or more parameters of the patterned substrate are typically measured, for example the overlay error between successive layers formed in or on the substrate. There are various techniques for making measurements of the microscopic structures formed in a lithographic process, including the use of a scanning electron microscope and various specialized tools. One form of specialized inspection tool is a scatterometer in which a beam of radiation is directed onto a target on the surface of the substrate and one or more properties of the scattered or reflected beam are measured. By comparing one or more properties of the beam before and after it has been reflected or scattered by the substrate, one or more properties of the substrate may be determined. This may be done, for example, by comparing the reflected beam with data stored in a library of known measurements associated with a known substrate property. Two main types of scatterometer are known. A spectroscopic scatterometer directs a broadband radiation beam onto the substrate and measures the spectrum (intensity as a function of wavelength) of the radiation scattered into a particular narrow angular range. An angularly resolved scatterometer measures the intensity of the scattered radiation as a function of angle. An ellipsometer measures polarization state. An angularly resolved scatterometer and an ellipsometer may use a monochromatic beam, a polychromatic beam (i.e., a beam with a plurality of components of different wavelengths), or a broadband beam.

Use of a broadband or polychromatic beam necessitates that the optics of the scatterometer be made achromatic. Techniques for making an optical system involving refractive optical elements achromatic are well known but become more complex and difficult as the number or range of wavelengths to be accommodated increases. Optical systems using mirrors, for example based on Schwarzschild optics, can be made achromatic more easily but are unsuitable, particularly for a scatterometer and an ellipsometer having high-NA optics, due to obscurations in the pupil plane.

SUMMARY

It is desirable, for example, to provide a scatterometry method and apparatus capable of making measurements using widely spaced wavelengths or wavelength ranges.

According to an aspect of the invention, there is provided an inspection apparatus configured to determine a value related to a parameter of a target pattern printed on a substrate by a lithographic process used to manufacture a device layer on a substrate, the apparatus comprising:

a radiation source arranged to selectively emit a first beam of radiation having a first wavelength in a first wavelength range or a second beam of radiation having a second wavelength in a second wavelength range, the second wavelength range being distinct from the first wavelength range;

an optical system arranged to direct the selected one of the first or second beams of radiation on to the target pattern and to project radiation redirected by the target pattern onto a detector to obtain a scatterometric spectra; and an adjustable optical element arranged to selectively effect a chromatic correction of the optical system according to Whether the first or second beam of radiation is emitted by the radiation source.

According to an aspect of the invention, there is provided an inspection method to determine a value related to a parameter of a target pattern printed on a substrate by a lithographic process used to manufacture a device layer on a substrate, the method comprising:

controlling a radiation source to selectively emit a first beam of radiation having a first wavelength in a first wavelength range or a second beam of radiation having a second wavelength in a second wavelength range, the second wavelength range being distinct from the first wavelength range;

using an optical system to direct the selected one of the first or second beams of radiation on to the target pattern and to project radiation redirected by the target pattern onto a detector to obtain a scatterometric spectra; and adjusting an adjustable optical element to selectively effect a chromatic correction of the optical system according to whether the first or second beam of radiation is emitted by the radiation source.

According to an aspect of the invention, there is provided an inspection apparatus configured to determine a value related to a parameter of a target pattern printed on a substrate by a lithographic process used to manufacture a device layer on a substrate, the apparatus comprising:

an optical system arranged to direct a first beam of radiation having a first wavelength in a first wavelength range or a second beam of radiation having a second wavelength in a second wavelength range, the second wavelength range being distinct from the first wavelength range, on to the target pattern and to project radiation redirected by the target pattern onto a detector to obtain a scatterometric spectra, the optical system comprising an objective lens having a pupil plane and arranged to collect the radiation redirected by the target pattern and an imaging optical system arranged to project an image of the pupil plane onto the detector; and an adjustable optical element arranged to selectively effect a chromatic correction of the optical system according to whether the first or second beam of radiation is directed by the optical system.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 2 depicts a first scatterometer according to an embodiment of the invention;

FIG. 3 depicts a second scatterometer according to an embodiment of the invention;

DETAILED DESCRIPTION

Figure 1:
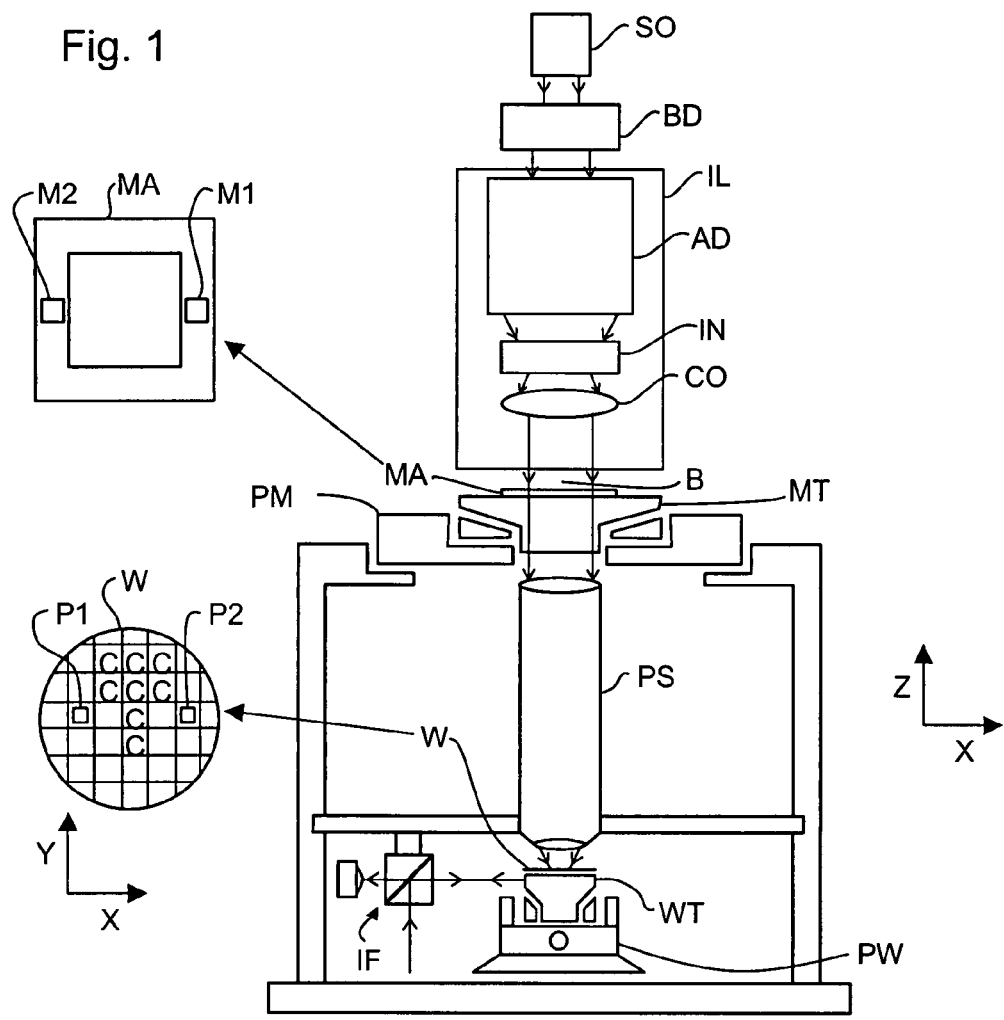
FIG. 1a depicts a lithographic apparatus.
FIG. 1b depicts a lithographic cell or cluster.

FIG. 1a schematically depicts a lithographic apparatus. The apparatus comprises:

- an illumination system (illuminator) IL configured to condition a radiation beam B (e.g. UV radiation or DUV radiation);
- a support structure (e.g. a mask table) MT constructed to support a patterning device (e.g. a mask) MA and connected to a first positioner PM configured to accurately position the patterning device in accordance with certain parameters;
- a substrate table (e.g. a wafer table) WT constructed to hold a substrate (e.g. a resist coated wafer) W and connected to a second positioner PW configured to accurately position the substrate in accordance with certain parameters; and
- a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more support structures). In such "multiple stage" machines the additional tables and/or support structures may be used in parallel, or preparatory steps may be carried out on one or more tables and/or support structures while one or more other tables and/or support structures are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1a, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1a) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-) magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 1B:
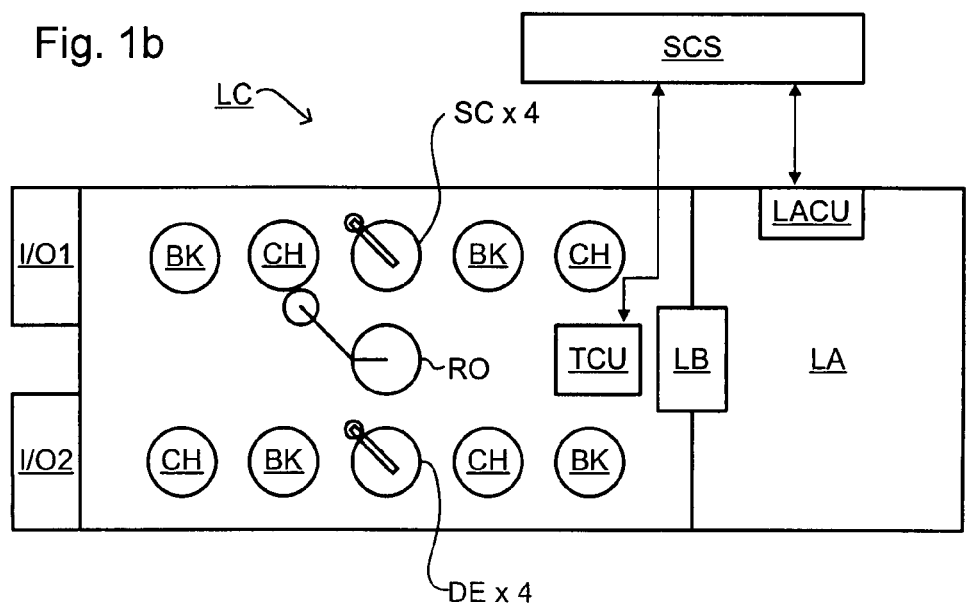

As shown in FIG. 1b, the lithographic apparatus LA forms part of a lithographic cell LC, also sometimes referred to as a lithocell or lithocluster, which also includes apparatus to perform one or more pre- and post-exposure processes on a substrate. Conventionally these include one or more spin coaters SC to deposit a resist layer, one or more developers DE to develop exposed resist, one or more chill plates CH and one or more bake plates BK. A substrate handler, or robot, RO picks up a substrate from input/output ports I/O1, I/O2, moves it between the different process devices and delivers it to the loading bay LB of the lithographic apparatus. These devices, which are often collectively referred to as the track, are under the control of a track control unit TCU which is itself controlled by the supervisory control system SCS, which also controls the lithographic apparatus via lithographic control unit LACU. Thus, the different apparatus may be operated to maximize throughput and processing efficiency.

In order that the substrate that is exposed by the lithographic apparatus is exposed correctly and consistently, it is desirable to inspect an exposed substrate to measure one or more properties such as overlay error between subsequent layers, line thickness, critical dimension (CD), etc. If an error is detected, an adjustment may be made to an exposure of one or more subsequent substrates, especially if the inspection can be done soon and fast enough that another substrate of the same batch is still to be exposed. Also, an already exposed substrate may be stripped and reworked (to improve yield) or discarded, thereby avoiding performing an exposure on a substrate that is known to be faulty. In a case where only some target portions of a substrate are faulty, a further exposure may be performed only on those target portions which are good. Another possibility is to adapt a setting of a subsequent process step to compensate for the error, e.g. the time of a trim etch step can be adjusted to compensate for substrate-to-substrate CD variation resulting from the lithographic process step.

An inspection apparatus is used to determine one or more properties of a substrate, and in particular, how one or more properties of different substrates or different layers of the same substrate vary from layer to layer and/or across a substrate. The inspection apparatus may be integrated into the lithographic apparatus LA or the lithocell LC or may be a stand-alone device. To enable most rapid measurements, it is desirable that the inspection apparatus measure one or more properties in the exposed resist layer immediately after the exposure. However, the latent image in the resist has a very low contrast—there is only a very small difference in refractive index between the part of the resist which has been exposed to radiation and that which has not—and not all inspection apparatus have sufficient sensitivity to make useful measurements of the latent image. Therefore measurements may be taken after the post-exposure bake step (PEB) which is customarily the first step carried out on an exposed substrate and increases the contrast between exposed and unexposed parts of the resist. At this stage, the image in the resist may be referred to as semi-latent. It is also possible to make measurements of the developed resist image—at which point either the exposed or unexposed parts of the resist have been removed—or after a pattern transfer step such as etching. The latter possibility limits the possibility for rework of a faulty substrate but may still provide useful information, e.g. for the purpose of process control.

FIG. 2 depicts a scatterometer SM1 according to an embodiment of the invention. It comprises a broadband (white light) radiation projector 2 which projects radiation onto a substrate W. The reflected radiation is passed to a spectrometer detector 4, which measures a spectrum 10 (i.e. a measurement of intensity as a function of wavelength) of the specular reflected radiation. From this data, the structure or profile giving rise to the detected spectrum may be reconstructed by processing unit PU, e.g. by Rigorous Coupled Wave Analysis and non-linear regression or by comparison with a library of simulated spectra as shown at the bottom of FIG. 2. In general, for the reconstruction, the general form of the structure is known and some parameters are assumed from knowledge of the process by which the structure was made, leaving only a few parameters of the structure to be determined from the scatterometry data. Such a scatterometer may be configured as a normal-incidence scatterometer or an oblique-incidence scatterometer.

According to an embodiment of the invention, the radiation source 2 is controllable to output selectively radiation in at least two distinct wavelength ranges, for example in the UV range (less than 300 nm) and in the near infra-red range (700-800 nm). The radiation source 2 may include a first source, such as a deuterium or xenon lamp, to emit UV radiation. Therefore, a first wavelength range that may be output by the radiation source may be in the range of about 200 to about 300 nm. The radiation source 2 may also include a second source, such as a quartz-tungsten-halogen source or a laser, or a laser diode, to emit near infra-red radiation. A second wavelength range that may be output by the radiation source may be in the range of from about 700 to about 800 nm. For both the first and second sources, one or more filters may be provided to limit the emitted wavelength range to that desired. To output radiation in the first and second wavelength ranges, the first and second sources are selectively energized. Alternatively, both sources may be simultaneously energized and respective shutters open and closed, or a beam diverting element moved, to select the output from the desired source. A single tunable source may also be used if the distinct wavelength ranges to be used are sufficiently close. To enable selection between more than two wavelength ranges, more than two selectable sources and/or tunable sources may be provided.

Radiation in the UV range is useful to measure CD; as attainable CD values shrink with improved lithographic techniques, shorter wavelengths are needed to make accurate measurements. Radiation in the near infra-red range is useful for measurement of overlay in polysilicon or polysilicon-like layers. Other wavelength ranges may be particularly useful for other measurements. By providing a source that can selectively emit in two or more distinct ranges, different measurements, such as CD and overlay, can be made in a single scatterometer. This reduces the number of scatterometers provided in a fab and increases throughput since multiple measurements can be made on a substrate without the need to transfer the substrate between scatterometers.

The optical system (not shown) of the scatterometer SM1 needs to be adapted to the different wavelength ranges to be used. Therefore, an adaptable optical element AE1 is provided at a suitable position in the optical system of the scatterometer and effects a necessary correction under control of control unit CU when different wavelength ranges are selected. The adjustable element AE1 may take various different forms. For example it may comprise a controllably-deformable mirror, a controllably-deformable lens element, a movable lens element, a plurality of lens elements whose relative positions may be adjusted and/or an exchangeable lens element.

Another scatterometer SM2 according to an embodiment of the invention is shown in FIG. 3. In this device, the radiation emitted by radiation source 2 is focused using lens system 12 through interference filter 13 and polarizer 17, reflected by partially reflective surface 16 and is focused onto substrate W via a microscope objective lens 15, which has a high numerical aperture (NA), desirably at least 0.9 or at least 0.95. An immersion scatterometer may even have a lens with a numerical aperture over 1. The reflected radiation then transmits through partially reflective surface 16 into a detector 18 in order to have the scatter spectrum detected. The detector may be located in the back-projected pupil plane 11, which is at the focal length of the lens 15, however the pupil plane may instead be re-imaged with auxiliary optics (not shown) onto the detector 18. The pupil plane is the plane in which the radial position of radiation defines the angle of incidence and the angular position defines the azimuth angle of the radiation. The detector is desirably a two-dimensional detector so that a two-dimensional angular scatter spectrum (i.e. a measurement of intensity as a function of angle of scatter) of the substrate target can be measured. The detector 18 may be, for example, an array of CCD or CMOS sensors, and may have an integration time of, for example, 40 milliseconds per frame.

A reference beam is often used, for example, to measure the intensity of the incident radiation. To do this, when the radiation beam is incident on the partially reflective surface 16 part of it is transmitted through the surface as a reference beam towards a reference mirror 14. The reference beam is then projected onto a different part of the same detector 18.

One or more interference filters 13 are available to select a wavelength of interest in the range of, say, 405-790 nm or even lower, such as 200-300 nm. The interference filter(s) may be tunable rather than comprising a set of different filters. A grating could be used instead of or in addition to one or more interference filters.

The detector 18 may measure the intensity of scattered radiation at a single wavelength (or narrow wavelength range), the intensity separately at multiple wavelengths or the intensity integrated over a wavelength range. Further, the detector may separately measure the intensity of transverse magnetic—(TM) and transverse electric—(TE) polarized radiation and/or the phase difference between the transverse magnetic—and transverse electric-polarized radiation.

Using a broadband radiation source 2 (i.e. one with a wide range of radiation frequencies or wavelengths—and therefore of colors) is possible, which gives a large etendue, allowing the mixing of multiple wavelengths. The plurality of wavelengths in the broadband desirably each has a bandwidth of $\delta\lambda$ and a spacing of at least $2\delta\lambda$ (i.e. twice the wavelength bandwidth). Several "sources" of radiation may be different portions of an extended radiation source which have been split using, e.g., fiber bundles. In this way, angle resolved scatter spectra may be measured at multiple wavelengths in parallel. A 3-D spectrum (wavelength and two different angles) may be measured, which contains more information than a 2-D spectrum. This allows more information to be measured which increases metrology process robustness. This is described in more detail in U.S. patent application publication no. US 2006-0066855, which document is hereby incorporated in its entirety by reference.

As in the embodiment described with respect to FIG. 2, radiation source 2 is controllable to emit radiation having a wavelength (or set of wavelengths) selectively in a first wavelength range or a second wavelength range by control unit CU. In accordance with the selected range, adjustable element AE2 is controlled to effect the necessary compensation of the optical system. Radiation source 2 and adjustable element AE2 may take the same forms as the corresponding parts in the embodiment described with respect to FIG. 2. In conjunction with the selection of the wavelength range or set output by the source 2, the one or more filters 13 are exchanged or adjusted.

As shown, the adjustable element AE2 is provided in the measurement branch of the scatterometer SM2, that is between the sample and the detector 18, but it may instead be provided in the illumination branch, that is between the radiation source 2 and the sample. Two or more adjustable elements may be provided, for example one in each branch. The adjustable element AE2 may also be provided within the high-NA objective 15.

Figure 4:
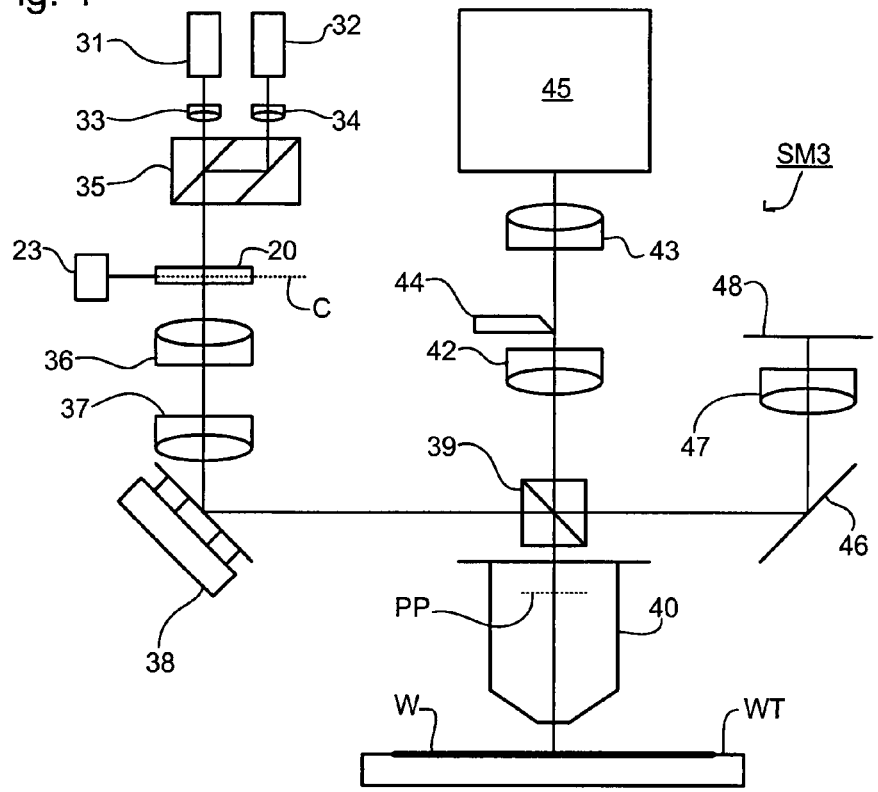
FIG. 4 depicts a third scatterometer according to an embodiment of the invention.

A scatterometer SM3 according to a further embodiment of the invention is shown in FIG. 4. In this embodiment, two sources 31, 32 provide beams of radiation having orthogonal polarization states, e.g. p and s, which are focused to form a virtual source by lenses 33 and 34 and combined by polarizing beam splitter 35. As described above, each of the sources is controllable to emit radiation in first or second wavelength ranges. An aperture plate 20 may be provided with one or more apertures to shape the illumination beam to, for example, conventional, annular, and/or multi-pole illumination. A selection mechanism 23, e.g., a motor, may be used to select one of a plurality of apertures of the plate.

Relay optics 36, 37 project a measurement spot onto substrate W, held by substrate table WT, via non-polarizing beam splitter 39 and objective lens 40. Mirror 38 is deformable under the control of the control unit CU (not shown) to effect a necessary chromatic correction in synchronism with the selected wavelength range output by the sources 31, 32. The objective lens 40 has a high NA, e.g. greater than 0.9 or 0.95, so that it forms a pupil plane PP internally, this is re-imaged onto detector 45, e.g. a CCD array or other form of camera, by lenses 42 and 43. A removable knife edge 44 is provided for focusing.

The non-polarizing beam splitter 39 directs a part of the incident beam to reference mirror 48, via mirror 46 and lens 47, from where it is returned and directed toward the camera 45 to form a reference spot to enable the effects of any source intensity variations to be removed.

Figure 5:
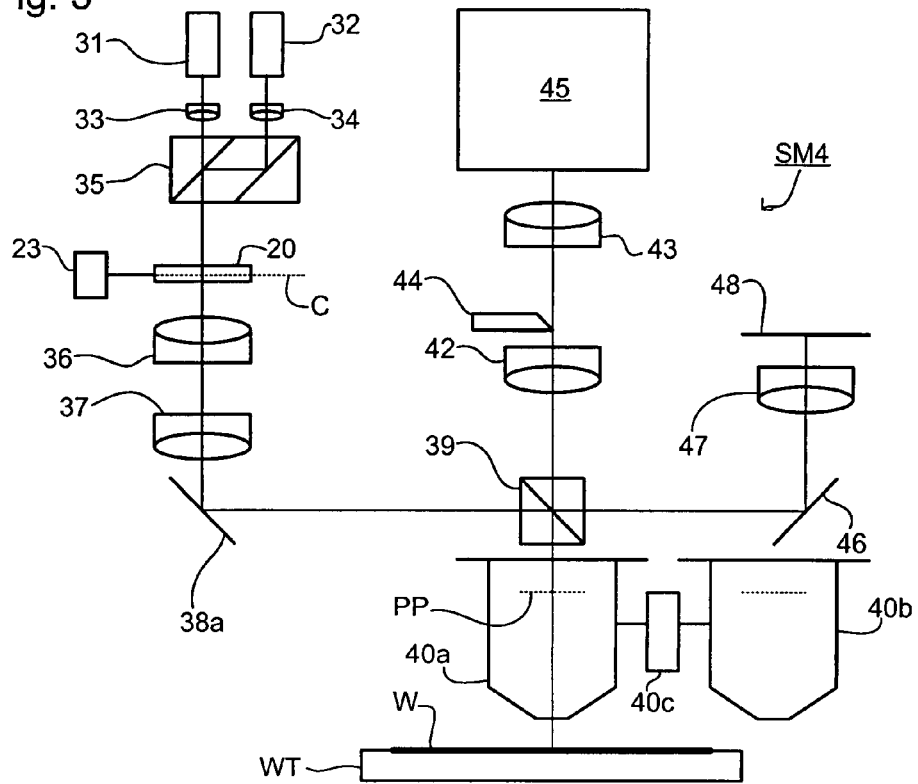
FIG. 5 depicts a fourth scatterometer according to an embodiment of the invention.

A scatterometer SM4 according to a further embodiment of the invention is shown in FIG. 5. This scatterometer is largely the same as the scatterometer SM3 described above and a description of the common parts will therefore be omitted.

In place of the deformable mirror 38, the scatterometer SM4 has a simple folding mirror 38a, which may be half-silvered to couple in illumination for a focusing system (not shown). To effect the necessary correction of the optical system according to the wavelength range selected, two (or more) exchangeable objective lenses 40a, 40b are provided together with an actuator 40c to effect the exchange of objectives. One of the exchangeable objectives is optimized for each of the wavelength ranges (or sets) that can be output by the sources 31, 32. As an alternative, an adjustable element may also be provided within the high-NA objective 40.

In any of the scatterometers described above, the target on substrate W may be a grating which is printed such that after development, the bars are formed of solid resist lines. The bars may alternatively be etched into the substrate. The target pattern is chosen to be sensitive to a parameter of interest, such as focus, dose, overlay, chromatic aberration in the lithographic projection apparatus, etc., such that variation in the relevant parameter will manifest as variation in the printed target. For example, the target pattern may be sensitive to chromatic aberration in the lithographic projection apparatus, particularly the projection system PL, and illumination symmetry and the presence of such aberration will manifest itself in a variation in the printed target pattern. Accordingly, the scatterometry data of the printed target pattern is used to reconstruct the target pattern. The parameters of the target pattern, such as line width and shape, may be input to the reconstruction process, performed by a processing unit PU, from knowledge of the printing step and/or other scatterometry processes.

There are two basic methods to determine the value of a parameter of interest of the target, e.g. CD, from the data (referred to as a spectrum) obtained from the scatterometer: iterative modeling and library searching. In iterative modeling techniques, a theoretical model of the target structure is used to calculate the spectrum that would be obtained from the target as a function of the parameter of interest. Starting with an initial or seed value, a predicted spectrum is calculated and compared to the measured spectrum so that the estimation of the parameter value can be improved. This process is repeated for a number of iterations until the predicted spectrum matches the measured spectrum to within a desired margin of error at which point it is assumed that the actual value of the parameter is equal to the predicted value of the parameter used to obtain the predicted spectrum to within a desired degree of precision.

In a library search, a library of predicted spectra is constructed, again using a model relating spectra to parameter values, and the measured spectra is compared to the library entries to determine the closest match. The number of entries in the library is determined by the range of possible parameter values expected, which is dependent on how accurately the parameter value can be guessed in advance, and the desired accuracy of measurement.

Another technique that can be used in scatterometry is Principal Component Analysis (PCA). In this technique, a matrix of test or calibration patterns is printed with varying values of the parameter(s) of interest. Spectra are obtained for each of the test patterns and analyzed to derive a set of principal components (basis functions) so that each spectrum can be expressed as by a set of coefficients multiplying the principal components. From the known parameter values of the test patterns can then be derived a function linking the coefficients to the parameter values. A spectrum from a measurement target is decomposed into a set of coefficients multiplying the principal components and the coefficient values used to determine the parameter values.

In order to ensure accuracy in scatterometry measurements it is necessary to ensure that the optical system is, within desired limits, free of aberrations. This requires that the aberrations in the optical system be measured. The conventional approach to measurement of aberrations in an optical system such as that used in a scatterometer is interferometry. However, interferometric techniques require additional hardware, are time consuming and difficult to perform on an apparatus that is in use. Accordingly, periodic calibration and diagnostic monitoring cannot be performed without taking the scatterometer out of use for a significant period of time.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography, a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. An inspection apparatus configured to determine a value related to a parameter of a target pattern printed on a substrate by a lithographic process used to manufacture a device layer on a substrate, the apparatus comprising:
    a radiation source configured to produce a first and a second beam, further arranged to selectively emit the first beam of radiation having a first wavelength in a first wavelength range or the second beam of radiation having a second wavelength in a second wavelength range, the second wavelength range being distinct from the first wavelength range, wherein the radiation source comprises a first radiation sub-source configured to generate radiation of the first wavelength and a second radiation sub-source configured to generate radiation of the second wavelength;
    an optical system arranged to direct the selected one of the first or second beams of radiation on to the target pattern and a first adjustable optical element arranged to selectively project radiation redirected by the target pattern onto a detector in synchronism with the selected wavelength of the first or second beam of radiation to obtain a scatterometric spectra; and
    a second adjustable optical element arranged to selectively effect a chromatic correction of the optical system in synchronism with when the selected wavelength of the first or second beam of radiation is emitted by the radiation source.

2. The apparatus of claim 1, wherein the first wavelength range is 5 to 300 nm.

3. The apparatus of claim 1, wherein the second wavelength range is 400 to 800 nm.

4. The apparatus of claim 1, wherein the first beam of radiation comprises a plurality of components each having a respective wavelength in the first wavelength range.

5. The apparatus of claim 1, wherein the second beam of radiation comprises a plurality of components each having a respective wavelength in the second wavelength range.

6. The apparatus of claim 1, wherein the first beam of radiation is a broadband beam comprising a range of wavelengths in the first wavelength range.

7. The apparatus of claim 1, wherein the second beam of radiation is a broadband beam comprising a range of wavelengths in the second wavelength range.

8. The apparatus of claim 1, wherein the second adjustable optical element comprises a deformable mirror.

9. The apparatus of claim 1, wherein the second adjustable optical element comprises an adjustable refractive lens element.

10. The apparatus of claim 1, wherein the second adjustable optical element comprises a refractive lens element and an actuator arranged to adjust the position and/or orientation of the refractive lens element.

11. The apparatus of claim 1, wherein the second adjustable optical element comprises a pair of refractive lens elements and an actuator arranged to adjust the relative position of the pair of refractive lens elements.

12. The apparatus of claim 1, wherein the second adjustable optical element comprises a plurality of exchangeable optical elements and an actuator arranged to selectively position one of the exchangeable optical elements in the optical system.

13. The apparatus of claim 1, wherein the optical system comprises an objective lens system and the second adjustable optical element is provided in the objective lens system.

14. The apparatus of claim 1, wherein the second adjustable optical element comprises a plurality of objective lens units selectively positionable in the optical system.

15. The apparatus of claim 1, wherein the first radiation sub-source and the second radiation sub-source are simultaneously energized.

16. A lithographic apparatus, comprising:
    an illumination optical system arranged to illuminate a pattern;
    a projection optical system arranged to project an image of the pattern on to a substrate;
    a radiation source configured to produce a first and a second beam; and an inspection apparatus configured to determine a value related to a parameter of a target pattern printed on a substrate by a lithographic process used to manufacture a device layer on a substrate, the apparatus comprising:

an optical system arranged to direct the first beam of radiation having a first wavelength in a first wavelength range or the second beam of radiation having a second wavelength in a second wavelength range on to the target pattern and a first adjustable optical element arranged to selectively project radiation redirected by the target pattern onto a detector in synchronism with the selected wavelength of the first or second beam of radiation to obtain a scatterometric spectra, the second wavelength range being distinct from the first wavelength range, wherein the radiation source comprises a first radiation sub-source configured to generate radiation of the first wavelength and a second radiation sub-source configured to generate radiation of the second wavelength, and a second adjustable optical element arranged to selectively effect a chromatic correction of the optical system in synchronism with when the selected wavelength of the first or second beam of radiation is directed by the optical system.

17. A lithographic cell comprising:

a coater arranged to coat a substrate with a radiation sensitive layer;

lithographic apparatus arranged to expose an image onto the radiation sensitive layer of the substrate coated by the coater;

developer arranged to develop the image exposed by the lithographic apparatus; and an inspection apparatus configured to determine a value related to a parameter of a target pattern printed on a substrate by a lithographic process used to manufacture a device layer on a substrate, the apparatus comprising:

a radiation source configured to produce a first and a second beam, and arranged to selectively emit the first beam of radiation having a first wavelength in a first wavelength range or the second beam of radiation having a second wavelength in a second wavelength range, the second wavelength range being distinct from the first wavelength range, wherein the radiation source comprises a first radiation sub-source configured to generate radiation of the first wavelength and a second radiation sub-source configured to generate radiation of the second wavelength, an optical system arranged to direct the selected one of the first or second beams of radiation on to the target pattern and a first adjustable optical element arranged to selectively project radiation redirected by the target pattern onto a detector in synchronism with the selected wavelength of the first or second beam of radiation to obtain a scatterometric spectra, and a second adjustable optical element arranged to selectively effect a chromatic correction of the optical system in synchronism with when the selected wavelength of the first or second beam of radiation is emitted by the radiation source.

18. An inspection method to determine a value related to a parameter of a target pattern printed on a substrate by a lithographic process used to manufacture a device layer on a substrate, the method comprising:

controlling a radiation source configured to produce a first and a second beam, and to selectively emit the first beam of radiation having a first wavelength in a first wavelength range or the second beam of radiation having a second wavelength in a second wavelength range, the second wavelength range being distinct from the first wavelength range, wherein a first radiation sub-source generates radiation of the first wavelength and a second radiation sub-source generates radiation of the second wavelength;

using an optical system to direct the selected one of the first or second beams of radiation on to the target pattern and a first adjustable optical element arranged to selectively project radiation redirected by the target pattern onto a detector in synchronism with the selected wavelength of the first or second beam of radiation to obtain a scatterometric spectra; and adjusting a second adjustable optical element to selectively effect a chromatic correction of the optical system in synchronism with when the selected wavelength of the first or second beam of radiation is emitted by the radiation source.

19. The inspection method of claim 18, further comprising:

simultaneously energizing the first radiation sub-source and the second radiation sub-source.

20. An inspection apparatus configured to determine a value related to a parameter of a target pattern printed on a substrate by a lithographic process used to manufacture a device layer on a substrate, the apparatus comprising:

a radiation source configured to produce a first and a second beam and an optical system arranged to direct the first beam of radiation having a first wavelength in a first wavelength range or the second beam of radiation having a second wavelength in a second wavelength range, the second wavelength range being distinct from the first wavelength range, wherein the radiation source comprises a first radiation sub-source configured to generate radiation of the first wavelength and a second radiation sub-source configured to generate radiation of the second wavelength, on to the target pattern and a first adjustable optical element arranged to selectively project radiation redirected by the target pattern onto a detector in synchronism with the selected wavelength of the first or second beam of radiation to obtain a scatterometric spectra, the optical system comprising an objective lens having a pupil plane and arranged to collect the radiation redirected by the target pattern and an imaging optical system arranged to project an image of the pupil plane onto the detector; and a second adjustable optical element arranged to selectively effect a chromatic correction of the optical system in synchronism with when the selected wavelength of the first or second beam of radiation is directed by the optical system.

* * * * *